(12) United States Patent
Teh et al.

(10) Patent No.: US 9,674,945 B2
(45) Date of Patent: Jun. 6, 2017

(54) HETEROGENEOUS INTEGRATION OF MICROFLUIDIC DEVICES IN PACKAGE STRUCTURES

(71) Applicant: Intel Corporation, Santa Clara, CA (US)

(72) Inventors: Weng Hong Teh, Phoenix, AZ (US); Kevin Lin, Beaverton, OR (US); Feras Eid, Chandler, AZ (US); Qing Ma, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 778 days.

(21) Appl. No.: 13/624,288

(22) Filed: Sep. 21, 2012

(65) Prior Publication Data

US 2014/0083858 A1    Mar. 27, 2014

(51) Int. Cl.
| | | |
|---|---|---|
| *H01L 23/34* | (2006.01) | |
| *H05K 1/02* | (2006.01) | |
| *H01L 25/00* | (2006.01) | |
| *H05K 1/18* | (2006.01) | |
| *H05K 3/00* | (2006.01) | |

(52) U.S. Cl.
CPC ........... *H05K 1/0272* (2013.01); *H01L 25/50* (2013.01); *H05K 1/0212* (2013.01); *H05K 1/185* (2013.01); *H05K 3/0097* (2013.01); *H05K 2201/097* (2013.01); *H05K 2203/1536* (2013.01); *H05K 2203/308* (2013.01); *Y10T 29/4913* (2015.01)

(58) Field of Classification Search
CPC ....................................................... H01L 25/50
USPC .......................................... 257/724; 438/106
See application file for complete search history.

(56) References Cited

U.S. PATENT DOCUMENTS

2011/0272575 A1* 11/2011 Kim ..................... B41J 2/04563
250/288
2012/0161331 A1* 6/2012 Gonzalez ................ H01L 24/19
257/774

FOREIGN PATENT DOCUMENTS

WO    WO 2012/054904    *    4/2012 ........... G01N 27/477

* cited by examiner

*Primary Examiner* — Jamie C Niesz
(74) *Attorney, Agent, or Firm* — Winkle, PLLC

(57) ABSTRACT

Methods of forming a microelectronic packaging structure and associated structures formed thereby are described. Those methods may include attaching a microfluidic die to a package structure, wherein the microfluidic die comprises a plurality of asymmetric electrodes that may be coupled with signal pads disposed within the package structure.

36 Claims, 12 Drawing Sheets

HETEROGENEOUS INTEGRATION OF MICROFLUIDIC DEVICES IN PACKAGE STRUCTURES

BACK GROUND OF THE INVENTION

Microelectromechanical systems (MEMS) devices are micro or nano devices that integrate mechanical and electrical elements on a common substrate, typically using microfabrication technology. MEMS devices can include actuators, sensors, switches, accelerometers, modulators, optical devices and microfluidic devices. Microfluidic devices can operate to control the flow of fluids across portions of the microfluidic device.

Currently, pumping of fluid in microfluidics devices can be challenging, since pressure driven flows can have a parabolic velocity profile over a given cross-section of the microfluidic device, such as when the fluid flows through a fluid channel region within the microfluidic device. This parabolic velocity may result in a near zero velocity of the fluid flow at the walls of the channel, and a maximum velocity of the fluid flow at the center of the channel, for example.

BRIEF DESCRIPTION OF THE DRAWINGS

While the specification concludes with claims particularly pointing out and distinctly claiming certain embodiments, the advantages of these embodiments can be more readily ascertained from the following description of the invention when read in conjunction with the accompanying drawings in which:

DETAILED DESCRIPTION OF THE PRESENT INVENTION

Figure 1A:
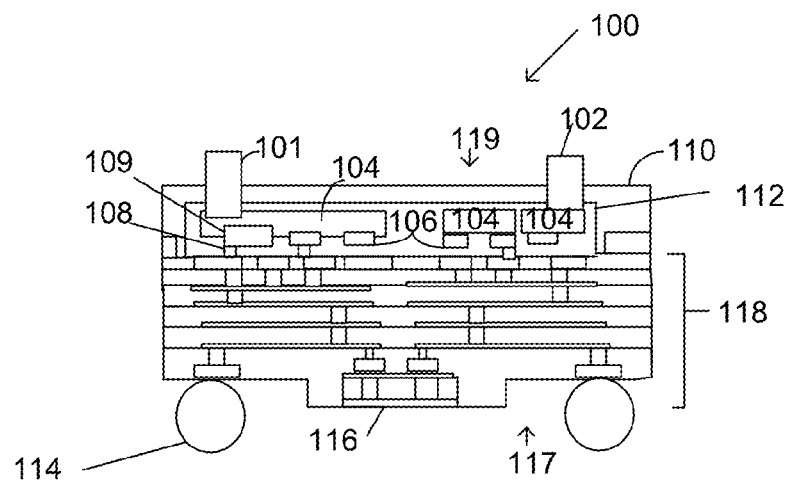
FIGS. 1a-1b represent structures according to various embodiments.

In the following detailed description, reference is made to the accompanying drawings that show, by way of illustration, specific embodiments in which the methods and structures may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed embodiment may be modified without departing from the spirit and scope of the embodiments. The following detailed description is, therefore, not to be taken in a limiting sense, and the scope of the embodiments is defined only by the appended claims, appropriately interpreted, along with the full range of equivalents to which the claims are entitled.

In the drawings, like numerals may refer to the same or similar functionality throughout the several views.

Methods and associated structures of forming and utilizing microelectronic structures, such as package structures, are described. Those methods may include attaching a microfluidic die to a package structure, wherein the microfluidic die comprises a plurality of asymmetric electrodes. The various embodiments included herein enable the creation of a low cost, small form factor, integration of microfluidic systems-on-package structures.

Figure 1B:
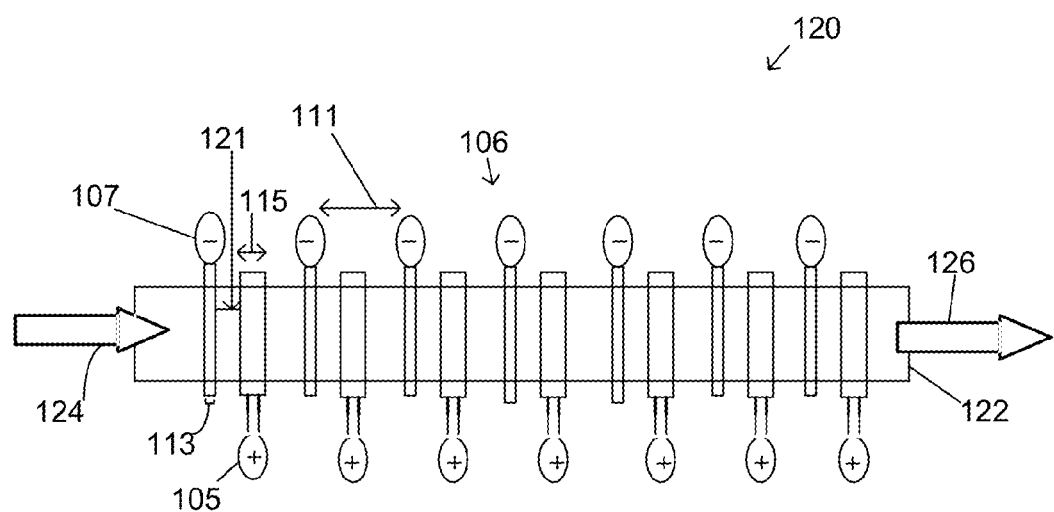

FIGS. 1a-1b illustrate embodiments of methods of forming microelectronic structures, such as an integrated package structure 100, for example. In an embodiment, the integrated package structure 100 may comprise a microfluidic chip 112, which may comprise a fluid inlet 101 and a fluid outlet 102. The microfluidic chip 112 may further comprise and/or be enclosed in a package structure, in some cases. The microfluidic chip 112 may further comprise regions 104 that may comprise various components, such as turning valves, reaction chambers, waste chambers, fluid chambers, etc., as well as other structures as appropriate for the particular application. The microfluidic chip 112 may function in such applications as a lab on a chip and total micro analysis systems, by illustration and not limitation.

The microfluidic chip 112 may comprise a plurality of electrodes 106, which in some embodiments may comprise a plurality of asymmetric electrodes 106, which enable precise control of the movement of fluids across portions of the microfluidic chip 112. In some cases this movement of fluid may be achieved through the application of alternating current (AC) fields to the plurality of asymmetric electrodes 106.

The microfluidic chip 112 may be coupled to a microelectronic package structure 118. In an embodiment, the plurality of asymmetric electrodes 106 may be directly coupled with interconnect structures 108 located within the package structure 118. The interconnect structures 108, which may comprise signal pads 108 in some embodiments, may be defined within the package structure 118 layers. The microfluidic chip 112 may comprise, in some embodiments, at least one heating element 109 that may be adjacent to the plurality of asymmetric electrodes 106, which may provide local heating for a controlled reaction.

In an embodiment, the package substrate 118 may comprise a coreless bumpless build-up Layer (BBUL) package architectures (wherein the package substrate may be built up on a temporary core/carrier capped with foil, which may then be removed after the package is separated from the temporary core). In other embodiments the package structure 118 may comprise any type of package according to the particular application. The plurality of asymmetric electrodes 106 may be independently powered and routed by the interconnect structures 108 of the package substrate 118 at a low voltage and frequency, thereby enabling the movement control (velocity) of small volumes of fluid (on the order of microliters to picoliters in some cases, but may vary) over small length scales with fast response times. In an embodiment, the volume of fluid capable of being moved may comprise a range from about 1 microliter to about 100 picoliters. This is important for fluid transport applications, such as in lab-on-a-chip or micro total analysis systems, that may or may not be integrated with a silicon logic/memory chip.

In another embodiment, the microfluidic chip 112 may be coupled to the microelectronic package 118 via an interposer structure, which may comprise a glass and/or PDMS material in some cases. The interposer may create an interface between the interconnect structures 108 of the package substrate 118 layers and the asymmetric electrodes 106 of the microfluidic chip 112, in cases where the coupling traces for the interconnect structures 108 and asymmetric electrodes 106 are different.

A die 116, which may comprise a silicon logic die 116 for example, may be disposed on a back side 117 of the integrated package structure 100. In other embodiments, the die 116 may be disposed/coupled on a front side 119 of the integrated package structure 100. In some embodiments the integrated package structure 100 may comprise a plurality of dies, which may be stacked upon one another, depending upon the particular embodiment. In some cases the die(s) 116 may be located/attached/embedded on either the front side 119, back side 117 or on/in some combination of the front and back sides 117, 119. In an embodiment, the die 116 may be partially or fully embedded in the package structure 118. In an embodiment, the die 116 may be coupled with the plurality of asymmetric electrodes 106 through the interconnect structures 108, wherein the die 116 may be capable of controlling the plurality of asymmetric electrodes 106.

The integrated package structure 100 enables the creation of a low cost, small form factor, integration of a microfluidics systems-on-package. The integration of the microfluidic chip 112 into the package structure 118 allows precise movement control of small volumes of fluid over small length scales, with fast response times. Additionally, by using electric fields with the application of modest voltages and frequencies, (for example, by applying voltages and frequencies in the ranges of BBUL and/or other types of package patterning design rules) in combination with asymmetric electrodes 106, a net "plug" flow of liquid can be realized across a flow channel region of the microfluidic chip 112. This improved flow characteristic comprises a velocity that is substantially constant throughout any cross-section except for a very small region near the fluid channel walls. This improved fluid flow reduces dispersive effects and improves the performance of the microfluidic chip/system, such as the integrated package structure 100. In an embodiment, the integrated package structure enables integration of a microfluidics system-in-package for local signal processing by the die 116, which may comprise a logic silicon die 116.

The integrated package structure 100 may comprise a passivation layer 110 that may be disposed on a top surface of the microfluidic chip 112. The passivation layer 110 may comprise any type of material serving to protect the microfluidic chip 112, such as a mold material and/or epoxy underfill layer, for example. Solder bumps 114 may be located on a die 116 side of the integrated package structure 100. In an embodiment, locating the solder bumps 114 on embedded die 116 side opposite the microfluidic chip 112 side enables an unobstructed side for microfluidic chip 112 integration, however, the solder bumps 114 may be located on the microfluidic chip 112 side, in some cases.

FIG. 1b depicts a top view of a fluid channel 120 that may be located in a portion of a microfluidic chip, such as the microfluidic chip 112 of FIG. 1a. The plurality of asymmetric electrodes 106 associated with the fluid channel 120 portion of the microfluidic chip 112 may control the velocity (speed and direction) of fluid movement across the microfluidic chip 112. The fluid channel 120 may comprise an inlet fluid flow 124 and an outgoing flow 126 that may travel across a surface 122 of the fluid channel 120. The fluid channel 120 of the microfluidic chip 112 may be a micromachined channel 120 in glass, PDMS or silicon for example. In an embodiment, the plurality of asymmetric electrodes 106 may be routed/connected to packaging build up layers, such as BBUL layers, for example, to connect to AC signal inputs. In an embodiment, the mechanical/electrical coupling of the asymmetric electrodes 106 to the signal pads of the package layers allows for individual control of the electrodes within the plurality of the asymmetric electrodes 106, thus allowing additional flexibility in liquid flow control, and better control of the separation between individual electrodes, which is advantageous for electrophoretic migration applications.

In an embodiment, the plurality of asymmetric electrodes 106 may comprise at least one of a small width asymmetric electrode 107 and a large width asymmetric electrode 105. Each of the small width electrode 107 and the large width electrode 105 comprise a charge, and can be either positive or negative depending upon the application. In an embodiment, a width 113 of the small width electrode 107 may comprise between about 10 and 30 microns, and a width 115 of the large width electrode 105 may comprise between about 40 and 120 microns, in other embodiments, the widths of the electrodes may vary according to the application. In an embodiment, the plurality of asymmetric electrodes 106 may comprise distinct electrodes that are not physically connected to each other, that is, there is a gap 121 between adjacent individual asymmetric electrodes. In an embodiment, the gap 121 between the large and small width electrodes 105, 107 may comprise between about 10 and 30 microns, but may be larger or smaller in other cases. A pitch 111 between two like charged electrodes may comprise between about 90 microns and about 250 microns, in some cases, in other cases, may be larger or smaller depending upon the application.

In an embodiment, the pitch 111 between two like charged electrodes may be compatible with such bump pitches as BBUL bump pitches and thermal compression bonding (TCB) bump pitches. In an embodiment, liquid velocities across the fluid channel 120 may comprise from about 100 microns per second to about 800 microns per second, but the velocity may vary depending upon the application. Excitation frequencies used to achieve such velocities may comprise between about 100 Hz to about 500 Hz, and applied voltages may range from about 0.4 V to about 1.2 V, however, excitation frequencies and voltages may vary depending upon specific requirements.

In an embodiment, the plurality of asymmetric electrodes 106 comprise alternating a small width electrode 107 and a large width electrode 105, wherein the small and large width electrodes 107, 105 comprise different charges from one another. For example the small width electrode 107 may comprise a negative charge and the large width electrode 105 may comprise a positive charge, or vice versa, depending upon the application. The plurality of asymmetric electrodes 106 may comprise any shape according to the particular application.

Figure 2A:
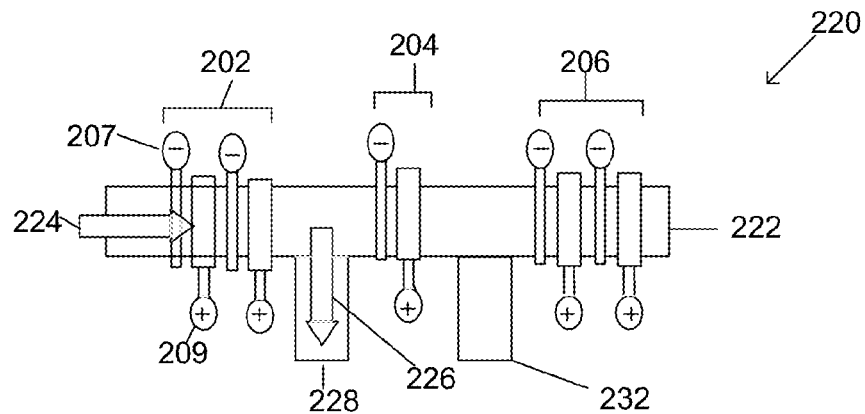
FIGS. 2a-2c represent structures according to embodiments.
Figure 2B:
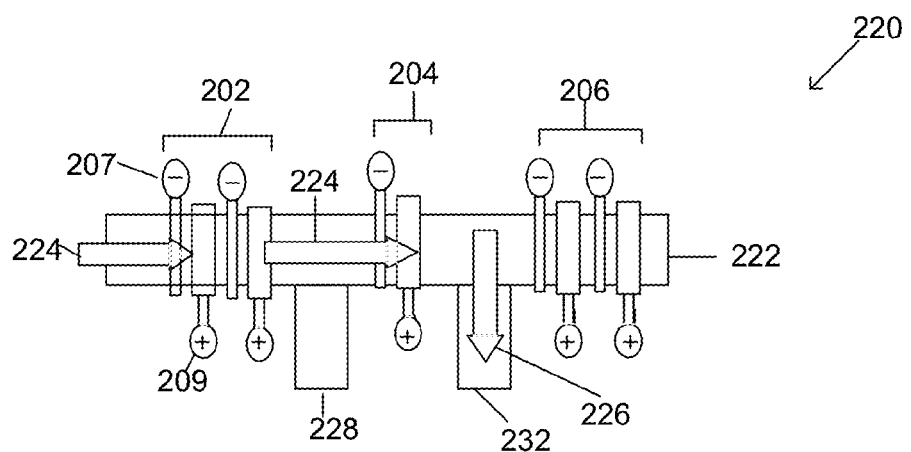
Figure 2C:
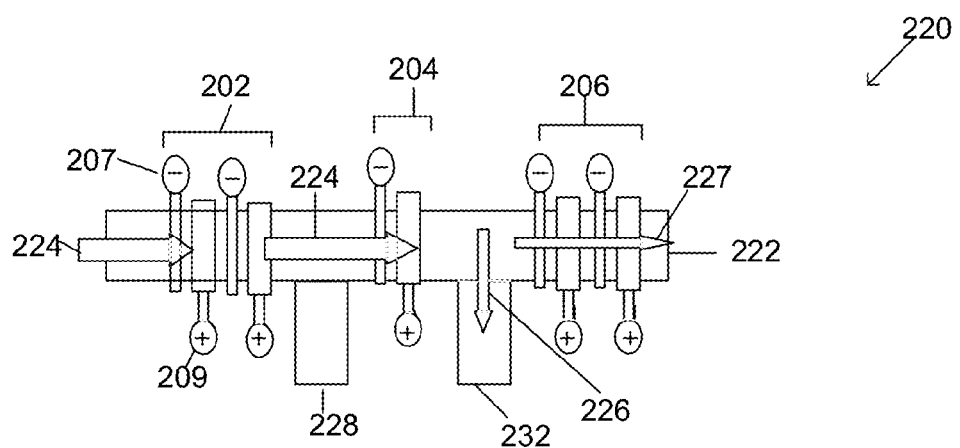

FIGS. 2a-2c depict example diagrams of different configurations of the plurality of asymmetric electrodes which enable fine control of fluid flow path and potential particle separation within fluid channels 220 of a microfluidic chip, (such as the microfluidic chip 112 in FIG. 1a) based on velocity. The electrodes may be controlled by the application of AC signals from the interconnect structures/signal pads of a package structure, such as by the package structure 118 via solder balls 114 of FIG. 1a, for example. In FIG. 2a, fluid may flow in direction 224 over a first set of electrodes 202 across fluid channel 220. The first set of electrodes 202 may comprise four individual electrodes, wherein a small width electrode 207 may be alternated and adjacent to a large width electrode 209. In an embodiment, the first set of electrodes 202 may comprise two small width electrodes 207 comprising a negative sign separated/adjacent and alternated with two large width electrodes 209 comprising a positive sign, as depicted in FIG. 2a.

A second set of electrodes 204 may comprise two individual electrodes, wherein a small width electrode 207 may be alternated and adjacent to a large width electrode 209. In an embodiment, the second set of electrodes 204 may comprise one small width electrode 207 comprising a negative sign separated and alternated with one large width electrodes 209 comprising a positive sign, as depicted in FIG. 2a. A third set of electrodes 206 may comprise four individual electrodes, wherein two small width electrodes 207 may be alternated and adjacent to two large width electrodes 209. In an embodiment, the third set of electrodes 204 may comprise two small width electrode 207 comprising a negative sign separated and alternated with two large width electrodes 209 comprising a positive sign, as depicted in FIG. 2a. The number of individual electrodes in each set may vary, as well as the number of sets of electrodes, according to the particular design requirements, and may comprise at least one of a negatively charged electrode adjacent a positively charged electrode.

In an embodiment, a flow of liquid 224 may flow in a first direction 224 over the first set of electrodes 202 across the fluid channel 220. The first flow direction 224 may then be diverted into a second flow direction 226 that may flow over a second portion 228 of the fluid channel 220. In an embodiment, the second flow direction 228 may be oriented in a perpendicular angle to the first flow direction 224, however the angles of the flow directions and portions of the fluid channel may depend on the particular application.

Thus, the flow of a liquid may occur over the first set of electrodes 202 and may be diverted away from the second and third set of electrodes 204, 206, as shown in FIG. 2a. In an embodiment, the flow may be directed across the fluid channel according to AC signals/frequency that may be applied to certain regions/set of electrodes of the fluid channel, and not across others, according to particular design requirements. For example, signals may be applied in such a manner that flow occurs over the first set of electrodes 202 and is diverted from the second and third set of electrodes 204, 206, wherein the second and third set of electrodes may experience substantially no flow. In an embodiment, the magnitudes of flows 224, 226 may be the same; in other embodiments, they may be different from one another.

FIG. 2b depicts an embodiment wherein the first flow direction of a liquid 224 may occur/flow over the first set and second sets of electrodes 202, 204 and may be diverted into a second flow direction 226 away from the third set of electrodes 206 (wherein the third set of electrodes may experience substantially no flow) into a third portion of the fluid channel 232, by the application of signals from signal pads from the package structure, such as package structure 118 of FIG. 1a. In an embodiment, the magnitudes of flows 224, 226 may be the same; in other embodiments, they may be different from one another.

FIG. 2c depicts an embodiment wherein the first flow direction 224 of a fluid may occur/flow over the first set and second set of electrodes 202, 204 with reduced flows 226, 227 over the third set of electrodes 206. The reduced flows 226, 227 may be partially located in a third portion 232 of the fluid channel. In an embodiment, the magnitudes of flows 224, 226 may be the larger than the magnitudes of the reduced flows 226, 227. The reduced flow configuration of FIG. 2c comprises a shunting configuration. In an embodiment, fluid may be induced to flow across one of the first, second and third sets of asymmetric electrodes, wherein the fluid is capable of then being diverted away from the other two sets of electrodes. In other embodiments, by controlling the voltage and phase of different sets of electrodes, fluid may flow over any number of electrode sets and be diverted from any number of electrode sets, depending upon the particular application.

Figure 3:
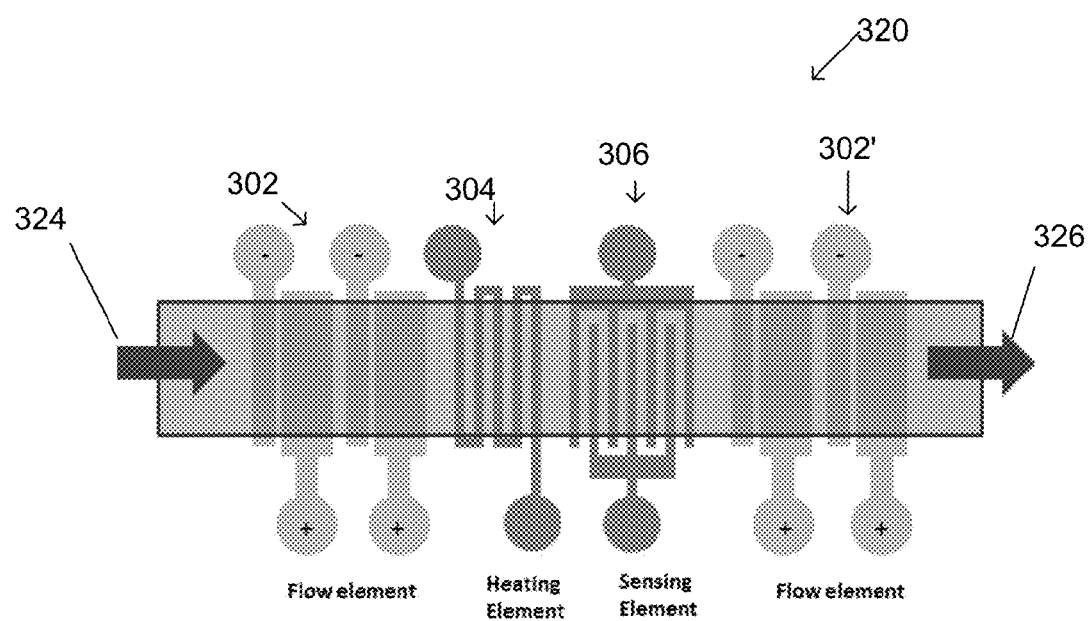
FIG. 3 represents a structure according to embodiments.

FIG. 3 comprises another embodiment wherein a fluid channel 320 portion of a microfluidic chip (such as microfluidic chip 112 of FIG. 1a) comprises integrated flow 302, 302', heating 304, and sensing 306 elements/electrodes. In an embodiment, electrical signals can be routed from the microfluidic chip to a die (such as to the die 116 of FIG. 1a, for example), using package routing, which may comprise BBUL routing in some cases. Close integration of heating and sensing elements/electrodes with flow elements/electrodes allows for better temperature control, flow control, and sensing accuracy, and enable different functionalities of the microfluidic systems on package integration.

Figure 4A:
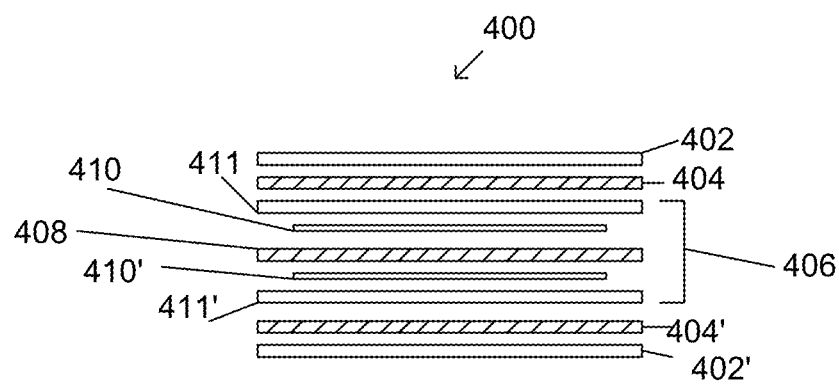
FIGS. 4a-4i represent methods of forming structures according to embodiments.
Figure 4B:
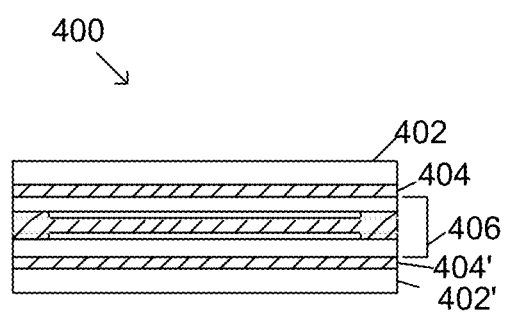

FIGS. 4a-4h depict embodiments wherein a process flow is utilized to fabricate a BBUL package integrated with a microfluidics chip, using a build-up cavity approach. The buildup cavity approach allows for minimal use of the z-height budget of the package structure. In FIGS. 4a-4b, a BBUL partially embedded process may include forming a coreless carrier structure 400, which may be formed by stacking up of low-E ABF (or other suitable dielectric material) and cavity foil for partially embedded BBUL architecture, in an embodiment.

Foils 402,402' such as a copper cavity foils 402,402' and dielectric materials 404, 404', that may be a low E ABF material 404, 404' may be assembled adjacent a coreless panel structure 406. The coreless panel structure 406 may comprise a dielectric layer 408 surrounded by conductive layers, such as a prepeg material 408 including opposing layers of inner, shorter copper foils 410, 410', and outer, longer copper foils 411, 411'. The coreless panel structure 406 may be a sacrificial coreless panel structure 406.

Figure 4C:
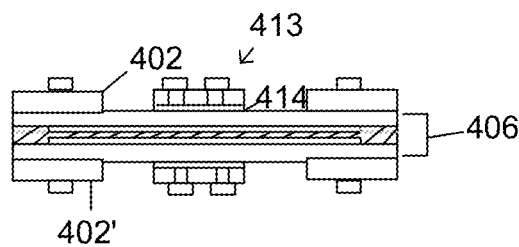

In FIG. 4c, the copper cavity foils 402, 402' may be patterned, using a dry film resist (DFR) process, for example. A microelectronic device 413, such as a silicon chip 413, may be attached to the coreless carrier structure 400 by using a chip attachment process. The microelectronic device 413 may include a die backside adhesive film (DBF) 414 located on a backside of the microelectronic device 413. In an embodiment, the microelectronic device 413 may be attached to the coreless carrier structure 400 using a DBF chip attach process.

Figure 4D:
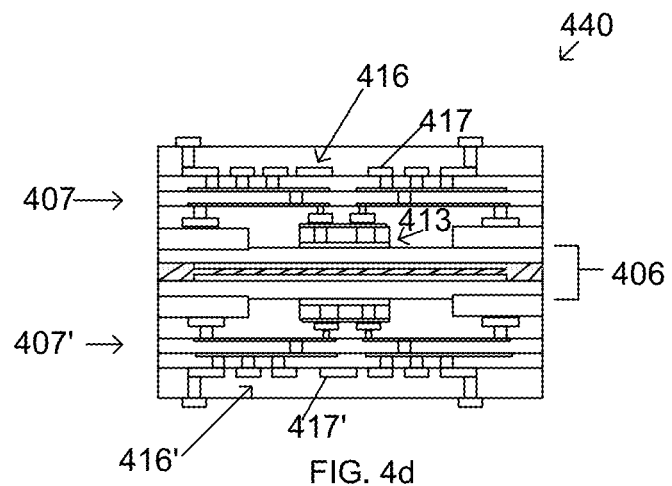

In FIG. 4d, a BBUL partially embedded die build up process may be utilized, wherein metal layers 407, 407' may be built up around the (separated by dielectric layers) to about 2 layers to about 6 layers of metal layer definition, in some cases, but the amount of metal layer 407, 407' built up may vary according to the particular application. In an embodiment, the build up process may include a signal pad/etch stop layer 416, 416' that may include a region of patterned individual signal pads 417, 417' for electrical/mechanical coupling/attachment of a microfluidic chip. In an embodiment, the signal pads 417, 417' may comprise copper.

Figure 4E:
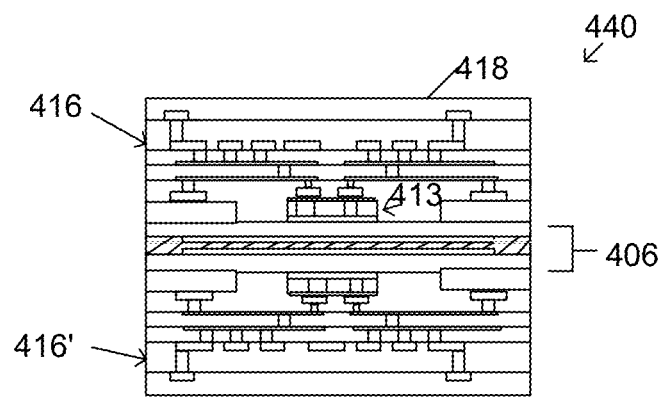
Figure 4F:
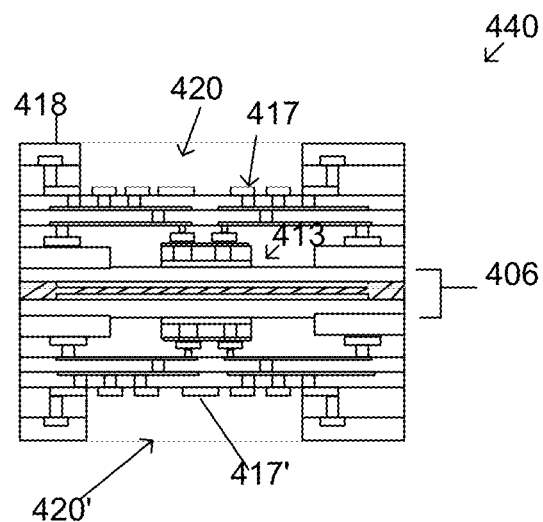

FIGS. 4e-4f depict the lamination and patterning of a thick dielectric layer 418, such as an ABF layer 418, for the creation of a microfluidic chip cavity 420, 420'. The microfluidic chip cavity 420, 420' may be formed using a sandblasting process, for example. Additionally, a DFR process may be employed which can be etch stopped at the signal pad/etch stop layers 416, 416', to reveal the copper signal pads 417, 417'.

Figure 4G:
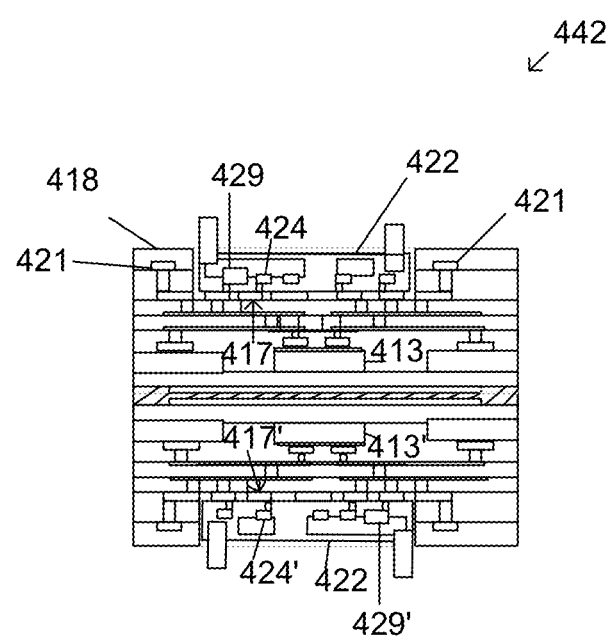

In FIG. 4g microfluidic chips 422, 422' may be attached/coupled to the BBUL package structure 440. The microfluidic chips 420, 420' may be coupled/stacked within the BBUL package structure 400 using thermocompression bonding (TCB) in some cases. The microfluidic chips 422, 422' comprise a plurality of asymmetric electrodes 424, 424' which couple mechanically and electrically to the signal pads 417, 417' of the microelectronic device 413,413' which are defined by the BBUL package build up layers. The microfluidic chips 422, 422' may comprise, in some embodiments, at least one heating element 429 that may be adjacent to the plurality of asymmetric electrodes 424, 424', which may provide local heating for a controlled reaction. The microelectronic devices may comprise in some cases memory devices 413, 413'. In an embodiment, within the thick ABF cavity layer 418, there may be an optional volume for RDL redistribution layer definition/patterning, or package on package (POP) pad 421 definition, such that the "embedding" of the microfluidic chips 422, 422' does not consume extra z-height budget of the overall package structure 440.

Figure 4H:
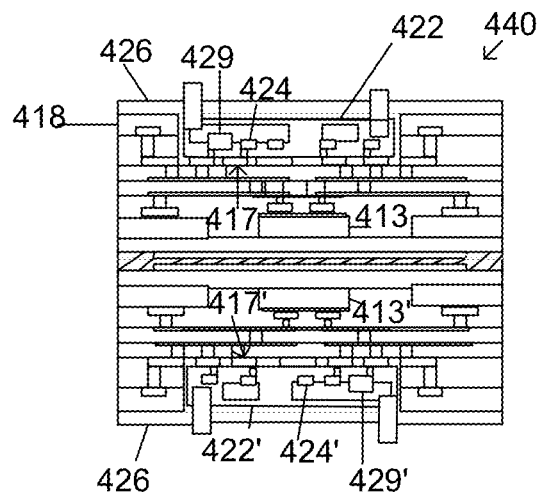
Figure 4I:
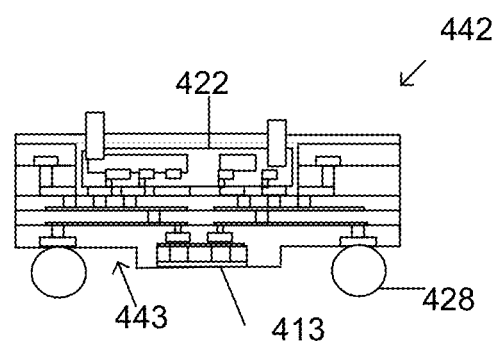

FIG. 4h depicts formation of a passivation layer 426 which may comprise passivation materials such as molding materials, epoxy flux, underfill materials, etc. After BBUL de-panel/routing processing and carrier 406 and ABF 408 removal, the sacrificial copper cavity may be removed to form an integrated microfluidic BBUL package structure 442 (FIG. 4i). This may be followed by solder ball 428 bumping on an embedded die side 443 of the integrated microfluidic package structure 442, in some cases.

Figure 5A:
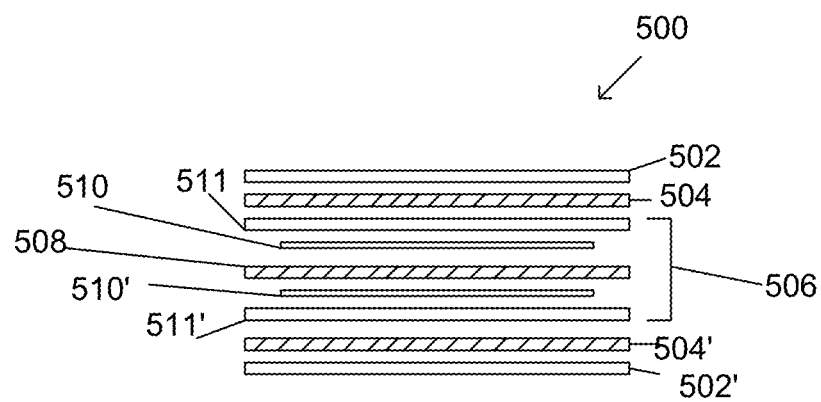
FIGS. 5a-5h represent methods of forming structures according to embodiments.
Figure 5B:
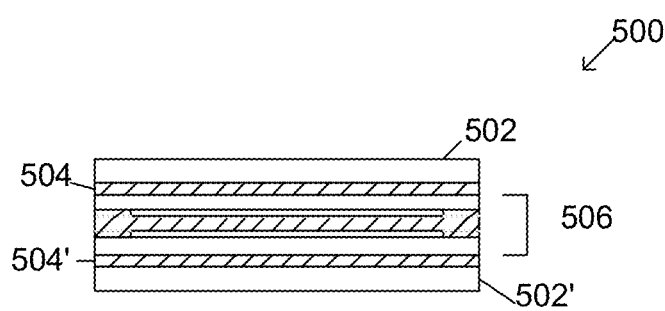

FIGS. 5a-5h depict an embodiment of a process flow to fabricate BBUL package integrated with microfluidics chip using a direct stack up approach followed by underfill/passivation. In FIG. 5a-5b, a BBUL partially embedded process may include forming a coreless carrier structure 500, which may be formed by stacking up of low-E ABF and Cu cavity foil for partially embedded BBUL architecture, in an embodiment.

Foils 502,502' such as a copper cavity foils 502,502' and ABF materials 504, 504' that may be a low E ABF material 504, 504' may be assembled adjacent a coreless panel structure 506. The coreless panel structure 506 may comprise a dielectric layer 508 surrounded by conductive layers, such as a prepeg material 508 including opposing layers of inner, shorter copper foils 510, 510', and outer, longer copper foils 511, 511'. The coreless panel structure may be a sacrificial coreless panel structure 506.

Figure 5C:
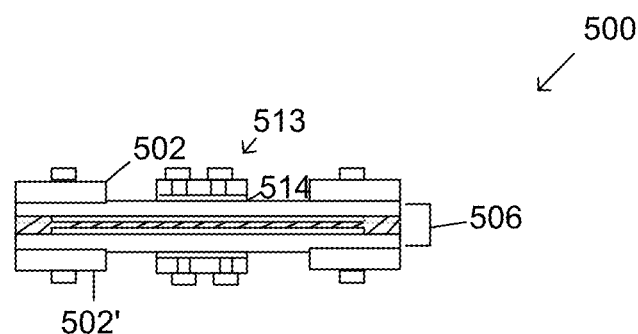

In FIG. 5c, the copper cavity foils 502, 502' may be patterned, using dry film resist (DFR), for example. A microelectronic device 513, such as a silicon chip 513, may be attached to the coreless carrier structure 500 by using a chip attachment process. The microelectronic device 513 may include a die backside adhesive film (DBF) 514 located on a backside of the microelectronic device 513. In an embodiment, the microelectronic device 513 may be attached to the coreless carrier structure 500 using a DBF chip attach process.

Figure 5D:
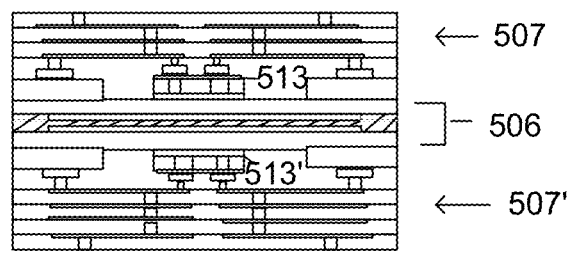
Figure 5E:
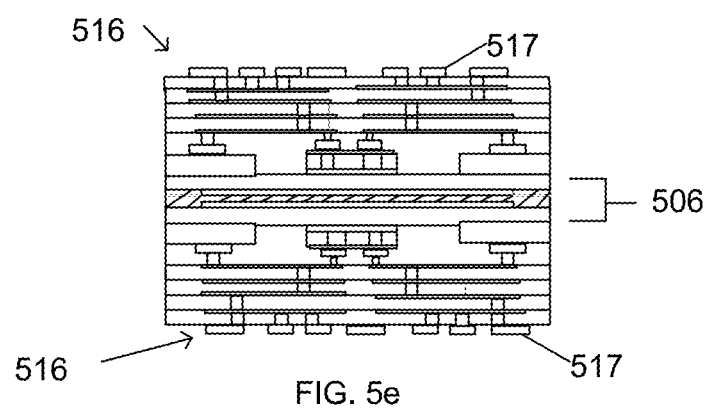

In FIG. 5d, a BBUL partially embedded die build up process may be utilized to build up metal layers 507,507' around the coreless panel structure 506, wherein about 2 to about 6 metal layers (separated by dielectric) may be built up around the core less panel structure 506, in some cases, but the amount of metal layer build up may vary according to the particular application. In FIG. 5e, the build up processing is used to define a signal pad layer 516, 516' that may include a region of patterned individual signal pads 517, 517' for electrical/mechanical coupling/attachment of a microfluidic chip. In an embodiment, the a microfluidic chip may be subsequently electrically/mechanically coupled/attached using TCB process may be utilized. If looser pitches are desired, a solder resist deposition and patterning followed by ball attach can be utilized.

Figure 5F:
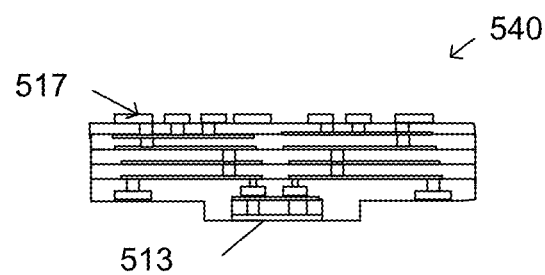
Figure 5G:
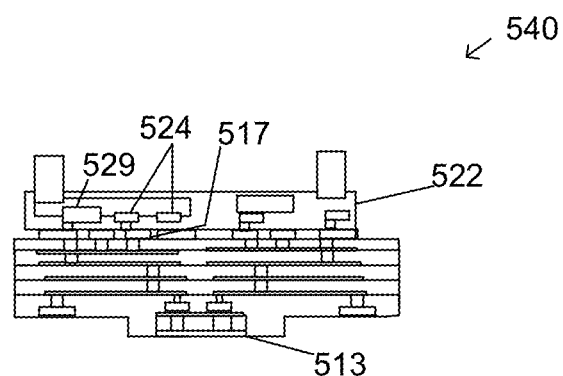
Figure 5H:
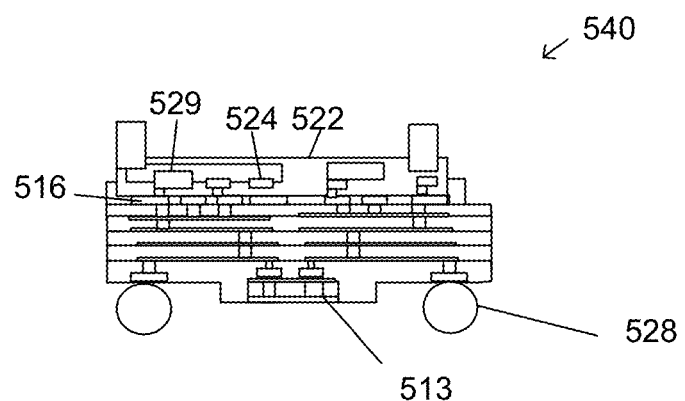

In FIG. 5f, de-panel/routing processing and carrier 506 and ABF 508 removal may be performed, and the sacrificial copper cavity may be removed. In FIG. 5g a microfluidic chip 522 (that may be similar to the microfluidic chip 422 in FIG. 4g, in some cases) may be attached/coupled to form an integrated microfluidic BBUL package structure 540. The microfluidic chip 522 may comprise a plurality of asymmetric electrodes 524 which couple mechanically and electrically to the signal pads 517 of the microelectronic device 513 which are defined by the BBUL package build up layers. The microfluidic chips 522 may comprise, in some embodiments, at least one heating element 529 that may be adjacent to the plurality of asymmetric electrodes 524, which may provide local heating for a controlled reaction. The microfluidic chip 522 may be coupled/stacked within the BBUL package structure 540 using thermo compression bonding (TCB) in some cases. In another embodiment, if looser pitches are desired, the microfluidic chip 522 may be mechanically/electrically coupled using a solder resist deposition and patterning. Solder ball 528 attachment may be performed, as well as formation of a passivation layer that may comprise at least one of a molding material, an epoxy material, and a flux underfill (FIG. 5h).

Thus, the various embodiments included herein enable mechanically and electrically integrating a microfluidics chip with packaging build up layers, creating a low z-height, low cost microfluidic systems-on-package. The electrical and mechanical integration allows for the use of electrophoretic migration using asymmetric electrodes, which can be independently powered and routed by build up layers (at low voltage and frequency), for the movement control of small volumes of fluid. The invention provides the ability to enable a local liquid heating chamber as well, if necessary, thereby adding to the flexibility of the microfluidics design and integration. Additionally, in some embodiments, by solder ball bumping a BBUL package on an embedded chip side, an unobstructed large surface area is provided for the stacking or embedding of the microfluidics chip on the signal pads created by the build up packaging layers. The embodiments further enable the fabrication of small form factor sensors that may be integrated with various packaging solutions. Such sensors can encapsulate sensing targeted species in liquids, for example.

Figure 6:
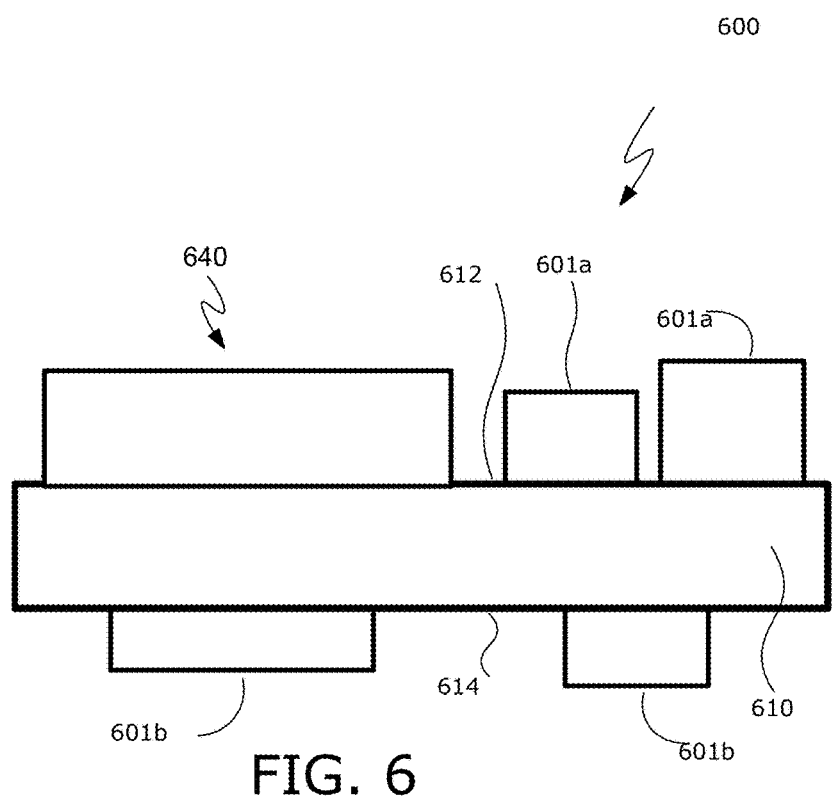
FIG. 6 represents a system according to embodiments.

Turning now to FIG. 6, illustrated is an embodiment of a computing system 600. The system 600 includes a number of components disposed on a mainboard 610 or other circuit board. Mainboard 610 includes a first side 612 and an opposing second side 614, and various components may be disposed on either one or both of the first and second sides 612, 614. In the illustrated embodiment, the computing system 600 includes an integrated microfluidic package structure disposed on the mainboard's first side 612, wherein the integrated microfluidic package structure may comprise any of the embodiments described herein.

System 600 may comprise any type of computing system, such as, for example, a hand-held or mobile computing device (e.g., a cell phone, a smart phone, a mobile internet device, a music player, a tablet computer, a laptop computer, a nettop computer, etc.). However, the disclosed embodiments are not limited to hand-held and other mobile computing devices and these embodiments may find application in other types of computing systems, such as desk-top computers and servers.

Mainboard 610 may comprise any suitable type of circuit board or other substrate capable of providing electrical communication between one or more of the various components disposed on the board. In one embodiment, for example, the mainboard 610 comprises a printed circuit board (PCB) comprising multiple metal layers separated from one another by a layer of dielectric material and interconnected by electrically conductive vias. Any one or more of the metal layers may be formed in a desired circuit pattern to route—perhaps in conjunction with other metal layers—electrical signals between the components coupled with the board 610. However, it should be understood that the disclosed embodiments are not limited to the above-described PCB and, further, that mainboard 610 may comprise any other suitable substrate.

In addition to the integrated microfluidic package structure 640, one or more additional components may be disposed on either one or both sides 612, 614 of the mainboard 610. By way of example, as shown in the figures, components 601a may be disposed on the first side 612 of the mainboard 610, and components 601b may be disposed on the mainboard's opposing side 614. Additional components that may be disposed on the mainboard 610 include other IC devices (e.g., processing devices, memory devices, signal processing devices, wireless communication devices, graphics controllers and/or drivers, audio processors and/or controllers, etc.), power delivery components (e.g., a voltage regulator and/or other power management devices, a power supply such as a battery, and/or passive devices such as a capacitor), and one or more user interface devices (e.g., an audio input device, an audio output device, a keypad or other data entry device such as a touch screen display, and/or a graphics display, etc.), as well as any combination of these and/or other devices.

In one embodiment, the computing system 600 includes a radiation shield. In a further embodiment, the computing system 600 includes a cooling solution. In yet another embodiment, the computing system 600 includes an antenna. In yet a further embodiment, the assembly 600 may be disposed within a housing or case. Where the mainboard 610 is disposed within a housing, some of the components of computer system 600—e.g., a user interface device, such as a display or keypad, and/or a power supply, such as a battery—may be electrically coupled with the mainboard 610 (and/or a component disposed on this board) but may be mechanically coupled with the housing.

Figure 7:
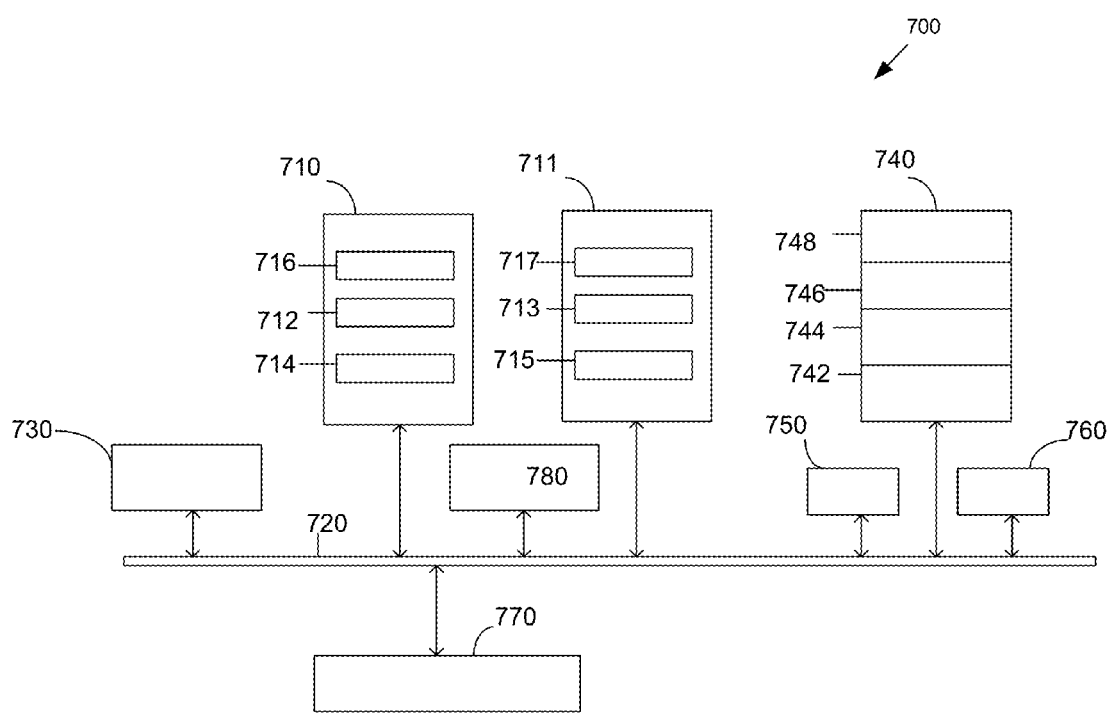
FIG. 7 represents a system according to embodiments.

FIG. 7 is a schematic of a computer system 700 according to an embodiment. The computer system 700 (also referred to as the electronic system 700) as depicted can embody/include an integrated microfluidic package structure/device that includes any of the several disclosed embodiments and their equivalents as set forth in this disclosure. The computer system 700 may be a mobile device such as a netbook computer. The computer system 700 may be a mobile device such as a wireless smart phone. The computer system 700 may be a desktop computer. The computer system 700 may be a hand-held reader. The computer system 700 may be integral to an automobile. The computer system 700 may be integral to a television.

In an embodiment, the electronic system 700 is a computer system that includes a system bus 720 to electrically couple the various components of the electronic system 700. The system bus 720 is a single bus or any combination of busses according to various embodiments. The electronic system 700 includes a voltage source 730 that provides power to the integrated circuit 710. In some embodiments, the voltage source 730 supplies current to the integrated circuit 710 through the system bus 720.

The integrated circuit 710 is electrically, communicatively coupled to the system bus 720 and includes any circuit, or combination of circuits according to an embodiment, including the integrated microfluidic package/device of the various embodiments included herein. In an embodiment, the integrated circuit 710 includes a processor 712 that can include any type of packaging structures according to the embodiments herein. As used herein, the processor 712 may mean any type of circuit such as, but not limited to, a microprocessor, a microcontroller, a graphics processor, a digital signal processor, or another processor. In an embodiment, the processor 712 includes any of the embodiments of the integrated microfluidic package structures disclosed herein. In an embodiment, SRAM embodiments are found in memory caches of the processor.

Other types of circuits that can be included in the integrated circuit 710 are a custom circuit or an application-specific integrated circuit (ASIC), such as a communications circuit 714 for use in wireless devices such as cellular telephones, smart phones, pagers, portable computers, two-way radios, and similar electronic systems. In an embodiment, the processor 712 includes on-die memory 716 such as static random-access memory (SRAM). In an embodiment, the processor 712 includes embedded on-die memory 716 such as embedded dynamic random-access memory (eDRAM).

In an embodiment, the integrated circuit 710 is complemented with a subsequent integrated circuit 711. In an embodiment, the dual integrated circuit 711 includes embedded on-die memory 717 such as eDRAM. The dual integrated circuit 711 includes an RFIC dual processor 713 and a dual communications circuit 715 and dual on-die memory 717 such as SRAM. The dual communications circuit 715 may be configured for RF processing.

At least one passive device 780 is coupled to the subsequent integrated circuit 711. In an embodiment, the electronic system 700 also includes an external memory 740 that in turn may include one or more memory elements suitable to the particular application, such as a main memory 742 in the form of RAM, one or more hard drives 744, and/or one or more drives that handle removable media 746, such as diskettes, compact disks (CDs), digital variable disks (DVDs), flash memory drives, and other removable media known in the art. The external memory 740 may also be embedded memory 748. In an embodiment, the electronic system 700 also includes a display device 750, and an audio output 760. In an embodiment, the electronic system 700 includes an input device such as a controller 770 that may be a keyboard, mouse, touch pad, keypad, trackball, game controller, microphone, voice-recognition device, or any other input device that inputs information into the electronic system 700. In an embodiment, an input device 770 includes a camera. In an embodiment, an input device 770 includes a digital sound recorder. In an embodiment, an input device 770 includes a camera and a digital sound recorder.

Although the foregoing description has specified certain steps and materials that may be used in the methods of the embodiments, those skilled in the art will appreciate that many modifications and substitutions may be made. Accordingly, it is intended that all such modifications, alterations, substitutions and additions be considered to fall within the spirit and scope of the embodiments as defined by the appended claims. In addition, it is appreciated that various microelectronic structures, such as general package structure features, are well known in the art. Therefore, the Figures provided herein illustrate only portions of an exemplary microelectronic device that pertains to the practice of the embodiments. Thus the embodiments are not limited to the structures described herein.

What is claimed is:

1. A method comprising:
   forming a package structure having a front side and a back side;
   forming a cavity in the package structure at the front side of the package structure;
   placing a microfluidic chip into the cavity;
   attaching the microfluidic chip to the package structure, wherein the microfluidic chip comprises a plurality of asymmetric electrodes;
   forming a passivation layer over the front side of the package structure and into the cavity; and
   attaching a second die proximate the back side of the package structure, wherein the second die is electrically coupled to the microfluidic chip.

2. The method of claim 1 further comprising wherein the plurality of asymmetric electrodes control the movement of fluid across the microfluidic chip.

3. The method of claim 2 further comprising wherein the plurality of asymmetric electrodes are capable of moving the fluid across a fluid channel of the microfluidic chip at a velocity of about 200 microns per second to about 800 microns per second.

4. The method of claim 1 further comprising wherein the microfluidic chip and the second die are disposed in a stacked arrangement in the package structure.

5. The method of claim 1 further comprising wherein the plurality of asymmetric electrodes are coupled to signal pads in the package structure.

6. The method of claim 1 further comprising wherein the package structure comprises an interposer structure to electrically couple the microfluidic chip with signal pads in the package structure.

7. The method of claim 1 further comprising wherein the package structure comprises a BBUL package.

8. The method of claim 1 further comprising wherein the package structure comprises a coreless package.

9. The method of claim 1 further comprising wherein the plurality of asymmetric electrodes are mechanically and electrically coupled with signal pads located in the package structure.

10. The method of claim 1 wherein the plurality of asymmetric electrodes comprise at least one of a small width electrode and a large width electrode.

11. The method of claim 1 further comprising wherein the second die comprises a memory die.

12. The method of claim 10 further comprising wherein a width of the small width electrode comprises between about 10 microns to about 30 microns, and wherein a width of the large width electrode comprises between about 40 microns and about 120 microns.

13. The method of claim 1 further comprising wherein a fluid channel of the microfluidic die comprises a first, a second and a third set of asymmetric electrodes, wherein fluid is capable of flowing across one of the first, second and third sets of asymmetric electrodes, and wherein fluid is capable of being diverted away from the other two sets of electrodes.

14. The method of claim 1 further comprising wherein a fluid channel of the microfluidic die comprises a first, a second and a third set of asymmetric electrodes, wherein a fluid is capable of flowing across the first set and second sets of asymmetric electrodes, and the fluid is capable of being diverted away from the third set of asymmetric electrodes.

15. The method of claim 1 further comprising wherein a fluid channel of the microfluidic die comprises a first, a second and a third set of asymmetric electrodes, wherein a maximum flow of a fluid is capable of flowing across the first set and second sets of asymmetric electrodes, and a diminished flow of a fluid is capable of flowing across the third set of asymmetric electrodes.

16. The method of claim 7 wherein the plurality of asymmetric electrodes are independently powered and routed by the BBUL package for the movement of fluid across a region of the microfluidic chip.

17. The method of claim 16 wherein the volume of fluid capable of moving comprises a range from about 1 microliter to about 100 picoliters.

18. A structure comprising:
    a package structure having a front side and a back side;
    a cavity formed in the package structure at the front side of the package structure;
    a microfluidic die disposed within the cavity and coupled to the package structure, wherein the microfluidic die comprises a plurality of asymmetric electrodes;
    a passivation layer formed over the front side of the package structure and into the cavity; and
    a second die attached to the package structure proximate the back side of the package structure, wherein the second die is electrically coupled to the microfluidic die.

19. The structure of claim 18 wherein the plurality of asymmetric electrodes are capable of controlling the movement of fluid across the microfluidic die.

20. The structure of claim 18 further comprising wherein the microfluidic die and the second die are disposed in a stacked arrangement in the package structure.

21. The structure of claim 18 further comprising wherein the plurality of asymmetric electrodes are coupled to signal pads in the package structure.

22. The structure of claim 18 further comprising wherein the package structure comprises an interposer structure to electrically couple the microfluidic die with the package structure.

23. The structure of claim 18 further comprising wherein the package structure comprises a portion of a coreless BBUL package.

24. The structure of claim 18 further comprising wherein the plurality of asymmetric electrodes comprise at least one of a small width electrode and a large width electrode.

25. The method of claim 18 further comprising wherein the second die comprises a memory die.

26. The structure of claim 24 further comprising wherein a width of the small width electrode comprises between about 10 microns to about 30 microns, and wherein a width of the large width electrode comprises between about 40 microns and about 120 microns.

27. The structure of claim 23 wherein the BBUL package comprises a portion of a stacked package structure.

28. The structure of claim 23 wherein the microfluidic die is fully embedded in the coreless BBUL package.

29. The structure of claim 18 further comprising the second die being at least partially embedded in the package structure.

30. The structure of claim 18 wherein the plurality of asymmetric electrodes comprise alternating small width and large width electrodes.

31. The structure of claim 30 wherein the small width and large width electrodes comprise opposite charges from each other.

32. The structure of claim 18 wherein the package structure comprises a portion of a coreless bumpless buildup package structure.

33. The structure of claim 18 wherein the microfluidic die comprises at least one fluid channel comprising at least one of an integrated flow element, a heating element, and a sensing element, wherein at least one of the integrated flow element, the heating element, and the sensing element are electrically routed to signal pads in the package structure.

34. The structure of claim 18 further comprising a system comprising:
 a bus is communicatively coupled to the package structure; and
 an eDRAM communicatively coupled to the bus.

35. The structure of claim 18 wherein the microfluidic die comprises an fluid inlet and a fluid outlet, wherein a passivation layer is disposed adjacent the fluid inlet and fluid outlet.

36. The structure of claim 18 wherein solder bumps are disposed adjacent the second die, and are not disposed on a microfluidic die side.

\* \* \* \* \*